United States Patent
Wu et al.

(10) Patent No.: US 8,824,543 B2
(45) Date of Patent: Sep. 2, 2014

(54) MULTILAYER DECODING USING PERSISTENT BITS

(75) Inventors: Yiyan Wu, Kanata (CA); Bo Rong, Ottawa (CA); Gilles Gagnon, Gatineau (CA); Sébastien Laflèche, Gatineau (CA); Charles Nadeau, Gatineau (CA); Omneya Issa, Ottawa (CA); Hong Liu, Ottawa (CA); Wei Li, Ottawa (CA)

(73) Assignee: Her Majesty the Queen in Right of Canada, as represented by the Minister of Industry, through the Communications Research Centre Canada, Ottawa, Ontario (CA)

( * ) Notice: Subject to any disclaimer, the term of this patent is extended or adjusted under 35 U.S.C. 154(b) by 511 days.

(21) Appl. No.: 13/162,732

(22) Filed: Jun. 17, 2011

(65) Prior Publication Data

US 2011/0310978 A1 Dec. 22, 2011

Related U.S. Application Data

(60) Provisional application No. 61/356,076, filed on Jun. 18, 2010.

(51) Int. Cl.
| | |
|---|---|
| H04N 7/26 | (2006.01) |
| H03M 13/11 | (2006.01) |
| H04N 21/2343 | (2011.01) |
| H04L 1/00 | (2006.01) |

(52) U.S. Cl.
CPC ..... *H04N 19/00533* (2013.01); *H03M 13/1165* (2013.01); *H04N 21/2343* (2013.01); *H04L 1/0041* (2013.01); *H04L 1/0003* (2013.01); *H04L 1/0009* (2013.01); *H04L 1/0057* (2013.01); *H04L 1/0084* (2013.01)
USPC ..................................... 375/240; 375/240.25

(58) Field of Classification Search
CPC .......... H04N 19/0053; H04N 21/2343; H04L 1/0003–1/0057; H04B 1/707; H03M 13/1165
See application file for complete search history.

(56) References Cited

U.S. PATENT DOCUMENTS

| | | | | |
|---|---|---|---|---|
| 6,266,817 | B1* | 7/2001 | Chaddha | 725/146 |
| 6,895,544 | B1* | 5/2005 | Park et al. | 714/776 |
| 7,096,400 | B2* | 8/2006 | Lim et al. | 714/748 |
| 7,607,154 | B2* | 10/2009 | Morello | 725/63 |
| 8,358,704 | B2* | 1/2013 | Shi et al. | 375/240.27 |

(Continued)

OTHER PUBLICATIONS

Abdulkareem A. Kadhim and Ahmed A. Hamad, "Turbo Codes With Internal Pilot Insertion", The Second International Conference on Next Generation Mobile Applications, Services, and Technologies, 2008, p. 343-347.

(Continued)

*Primary Examiner* — William C Vaughn, Jr.
*Assistant Examiner* — Luis M Perez

(57) ABSTRACT

The invention relates to a method of iterative multi-layer decoding of a multimedia communication signal, wherein persistent bits from various upper layers of the employed protocol stack are used in error correction decoding at a lower error-correction layer. The method includes saving persistent bits from successfully decoded FEC frames in memory, and using a subset of the saved bits in decoding of future frames. A smart controller is used to analyze frames for the presence and location of persistent bits, for saving thereof in memory, and for inserting saved persistent bits into a next frame at successive decoding iterations thereof.

9 Claims, 11 Drawing Sheets

(56) References Cited

U.S. PATENT DOCUMENTS

| | | | |
|---|---|---|---|
| 8,503,551 B2* | 8/2013 | Ko et al. | 375/260 |
| 8,655,169 B2* | 2/2014 | Perkins et al. | 398/26 |
| 2005/0031039 A1 | 2/2005 | Chou et al. | 375/240.18 |
| 2005/0089068 A1* | 4/2005 | Sun et al. | 370/509 |
| 2007/0147314 A1 | 6/2007 | Taleb et al. | 370/338 |
| 2007/0291836 A1 | 12/2007 | Shi et al. | 375/240.01 |
| 2009/0092174 A1 | 4/2009 | Wang | 375/132 |
| 2011/0110462 A1 | 5/2011 | Lee et al. | 375/301 |
| 2011/0119705 A1 | 5/2011 | Meyers | 725/37 |

OTHER PUBLICATIONS

Tobias Breddermann, Ismet Aktas and Florian Schmidt, "Iterative Source-Channel Decoding with Cross-Layer Support for Wireless VoIP", International ITG Conference on Source and Channel Coding (Siegen, Germany) Jan. 18-21, 2010, Paper 17.

Amitav Mukherjee and Hyuck M. Kwon, "CSI-Adaptive Encoded Pilot-Symbols for Iterative OFDM Receiver with IRA Coding", 2009; in: Vehicular Technology Conference, 2009. VTC Spring 2009. IEEE 69th Issue Date: Apr. 26-29, 2009 pp. 1-5.

M. Oberg and P.H. Siegel, "Application of distance spectrum analysis to turbo code performance improvement", Proc. 35$^{th}$ Allerton Conf., 1997, pp. 701-710.

Mi-Kyung Oh et al., "Iterative Channel Estimation and LDPC Decoding With Encoded Pilots", IEEE Transactions on Vehicular Technology, vol. 57, No. 1, Jan. 2008, p. 273.

J. Hagenauer, "Source-Controlled Channel Decoding", IEEE Transactions on Communications, vol. 43, No. 9, Sep. 1995.

Zhimin Yang, Shiju Li, Hao Feng, Thomas Honold and Guanding Yu, "Cross-Layer Iterative Decoding of Irregular LDPC Codes using Cyclic Redundancy Check Codes", WCNC 2009 proceedings.

Ruijing Hu, Michel Kieffer, Pierre Duhamel, "Protocol-Assisted Channel Decoding", 2011, Proc. IEEE International Conference on Communication.

R. G Woo, P Kheradpour, D. Shen, and D. Katabi, "Beyond the bits: cooperative packet recovery using physical layer information", in Proceedings ACM Int. Conf. on Mob. Comp. and Netw., 2007, pp. 147-158.

C. Marin, Y. Leprovost, M. Kieffer, and P. Duhamel, "Robust header recovery based enhanced permeable protocol layer mechanism", in Proceedings SPAWC, Jul. 2008.

U. Ali, M. Kieffer, and P. Duhamel, "Joint protocol-channel decoding for robust aggregated packet recovery at WiMAX MAC layer," in Proc. IEEE SPAWC, Peruggia, Italy, 2009, pp. 672-676.

F. Meriaux and M. Kieffer, "Robust IP and UDP-lite header recovery for packetized multimedia transmission," in Proc. IEEE ICASSP, Dallas, TX, 2010.

R. Hu, X. Huang, M. Kieffer, O. Derrien, and P. Duhamel, "Robust critical data recovery for MPEG-4 AAC encoded bitstreams," in Proc. IEEE ICASSP, Dallas, TX, 2010.

H. Jenkac, T. Stockhammer, and W. Xu, "Permeable-layer receiver for reliable multicast transmission in wireless systems," in Proc. of WCNC, Mar. 13-17, 2005, vol. 3, pp. 1805-1811.

C. Marin, P. Duhamel, K. Bouchireb, and M. Kieffer, "Robust video decoding through simultaneous usage of residual source information and MAC layer CRC redundancy," in Proc. of Globecom, 2007, pp. 2070-2074.

Advanced Television Systems Committee, Inc., Washington, D.C., "ATSC-Mobile DTV Standard, Part 1—ATSC Mobile Digital Television System", Document A/153 Part 1:2009, Oct. 15, 2009.

\* cited by examiner

LDPC Encoding Block

Preferred PB positions

MULTILAYER DECODING USING PERSISTENT BITS

CROSS-REFERENCE TO RELATED APPLICATIONS

The present invention claims priority from U.S. Provisional Patent Application No. 61/356,076 entitled "Cross-layer Channel Encoding and Iterative Decoding Using Deterministic Bits and Sequences", filed Jun. 18, 2010, which is incorporated herein by reference for all purposes.

TECHNICAL FIELD

The present invention generally relates to digital communication and broadcasting systems, and in particular relates to iterative multi-layer channel decoding in such systems.

BACKGROUND OF THE INVENTION

Modern communication systems typically utilize layered network model, with error correction and error detection mechanisms in at least some of the network layers, to transmit multimedia signals from a source to a remote recipient. The widely used OSI (Open System Interconnection) layered model partitions networking tasks into distinct layers. Control is passed from one layer to the next, starting at the application layer at a transmitting station, and proceeding to the bottom layer, over a communication channel to a receiving station, and back up the layer hierarchy. This layered structure facilitates network design, since each layer does not have to be aware of the information introduced by other layers, allowing heterogeneous contents to be delivered via the same communication network. The OSI model generally defines a protocol stack arranged in seven layers: 1) a physical (PHY) layer, which is the first and lowest layer and which defines the means of transmitting raw bits over a physical link connecting network nodes, 2) a data link layer which provides the functional and procedural means to transfer data between network entities and is responsible for Media Access Control (MAC), Flow Control and Error Checking, 3) a network layer, which is responsible for routing packets delivery including routing through intermediate routers, 4) a transport layer which provides end-to-end communication services for applications, 5) a session layer which provides the mechanism for opening, closing and managing a session between end-user application processes, 6) a presentation layer, which is responsible for the delivery and formatting of information to the application layer for further processing or display, and 7) an application layer, which supports application and end-user processes. In practice, various networking systems may implement a subset of these layers, which may be given different names according to respective Standards documents, and may further include sub-layers.

At the receiver, each layer starting with the physical layer attempts to provide perfect information to the upper layer. For that purpose, error-detecting codes, such as CRC or checksums, have been introduced at various places of standard protocol stacks combined with retransmission mechanisms for data packets deemed as corrupted. Forward error correction (FEC) processing, through FEC encoding at the transmitter and FEC decoding at the receiver, is typically used in one or more lower layers of the protocol stack, such as the PHY layer and/or the data link layer (DLL). Advantages of forward error correction are that a back-channel is not required and retransmission of data can be avoided.

FEC codes are able to correct both errors and erasures in a block of n symbols. An (n, k) block erasure code converts k source data into a group of n coded data, such that any k of the n encoded data can be used to reconstruct the original source data. Usually, the first k data in each group are identical to the original k source data (systematic code); the remaining (n–k) data are referred to as parity data. In coding theory an error is defined as a corrupted symbol in an unknown position, while an erasure is a corrupted symbol in a known position. In the case of streamed media packets, loss detection is performed based on the sequence numbers in the real-time transport protocol (RTP) packets.

In FEC codes redundant data are derived from the original data using techniques from coding theory. Traditional error correcting codes, such as parity, low-density parity check (LDPC), Reed-Solomon (RS), BCH, and Hamming codes, have recently attracted a substantial amount of attention. From the mathematical view, we explain the encoding and decoding process as follows. Cyclic redundancy check (CRC) codes may be used in the DLL to detect erroneous frames or packets.

In the standard OSI layered network model each layer operates substantially independently on other layers, which facilitates the system design and interoperability. However, it has been shown that cross-layer optimization of parameters may provide some advantages and result in a more efficient data transmission. In particular, joint source-channel encoding has been suggested in the art to enhance overall coding performance and/or reduce the amount of required processing at the receiver and/or transmitter end. The source coding typically occurs in application layer and includes data compression encoding to represent the source information, for example a video and/or audio signal, using fewer bits than the original representation of the source. This is accomplished by reducing redundancy in the transmitted signal, thereby making compress data critical. The joint source-channel decoding enables to jointly optimize the process of data compression at the source and the process of adding redundancy in the FEC channel coding. One disadvantage of the joint source-channel coding is that it couples several networking layers at both the transmitter and the receiver end, thereby complicating the system design.

Several prior art approaches have been disclosed to utilize redundant information introduced by various protocols of the layered protocol stack to aid in decoding. One approach utilizes the redundancy of the source encoded signal by means of a turbo-like exchange of extrinsic information between soft-decision source decoders and channel decoders. Another source of redundancy relates to header information, which can be exploited to support an iterative cross-layer decoding process. Tobias Breddermann et al, in an article entitled "Iterative Source-Channel Decoding with Cross-Layer Support for Wireless VoIP", paper 17, SCC 2010, Jan. 18-21, 2010, Siegen, Germany, disclosed a cross-layer approach for iterative source-channel decoding (ISCD) in wireless VoIP networks. The approach incorporates speech bits as well as protocol header bits into the ISCD process. The header bits take the role of pilot bits having perfect reliability. These bits are distributed over the frame as supporting points for the MAP decoder. Direct communication between non-adjacent layers enables the iterative exchange of extrinsic information between the source decoder located on the application layer and the channel decoder located on the physical layer. The ISCD decoder is based on the iterative exchange of extrinsic information between the SISO (Soft-Input/Soft-Output) channel decoder and the SDSD (soft-decision source decoder). This turbo-like process can provide decoding performance close to the Shannon limit assuming a sufficient number of decoding iterations. The interleaver π within the iterative loop plays a key role in such transmission systems. It spreads the extrinsic information of each single data bit over the complete data frame. This rearranged information can be reused in the SISO channel decoder and the SDSD, respectively, in order to refine the reliability information for each bit. The reliability information is commonly expressed in terms of log-likelihood ratios (LLRs). At the receiving end, the mobile device performs signal synthesis using the ISCD concept. The soft demodulated and deinterleaved packet is decoded by the SISO channel decoder that provides reliability information for each header bit and speech bit. After the separation of header and speech, the protocol headers are decoded and checked by their CRCs for residual bit errors. While packets with faulty headers are discarded within the protocol stack, packets with correctly decoded protocol headers are forwarded to the SDSD located on the application layer. Extrinsic information about the speech bits, calculated by the SDSD, can be passed back as additional a priori knowledge to the SISO channel decoder. The SISO channel decoder "smears" the perfect a priori knowledge of the header bits over some adjacent speech bits and generates extrinsic speech LLRs with increased reliability. This successfully works due to the fact that during channel encoding header bits and speech data bits are linked together producing output bits that contain information of protocol header bits as well as speech data bits. Since each header bit supports the soft decoding of speech bits located in its surrounding vicinity, they are equally spaced within the packet by the standard reference method (SRM). In this case, the header bits can be interpreted as pilot bits with perfect reliability that act as strong supporting points for the maximum a posteriori (MAP) channel decoder.

Zhimin Yang et al, in an article entitled "Cross-Layer Iterative Decoding of Irregular LDPC Codes using Cyclic Redundancy Check Codes", WCNC 2009 Proceedings, disclosed an iterative cross-layer decoder (ICLD) for irregular LDPC codes which uses CRC codes in the DLL. The key idea of the decoder of Yang et al is to use correctly decoded DLL frames as an aid for correcting the remaining erroneous DLL frames of one block of the LDPC code in the physical layer, which corresponds to one FEC frame. To accomplish this, the decoder exchanges relevant information between the PHY and DL layers by using a version of the iterative cross-layer decoding architecture. The method of Yang et al further exploits Unequal-Error Protection (UEP) property of irregular LDPC and both the multiple-error detection and single-error correction capabilities of the CRC code are used. The data link layer maps network packets to DLL frames by adding headers and appending CRC checksums. The resulting DLL frames are delivered to the physical layer. A total of m DLL frames account for one input block to the LDPC encoder, or one FEC frame. The block is encoded using the irregular parity-check matrix, so as to form some elite DLL frames which have a lower frame error probability than the other frames. At the receiver, the received signal is demodulated and the resulting Logarithm Likelihood Ratio (LLR) is injected into the cross-layer iterative decoder. The decoder performs LDPC decoding and CRC error correction/detection jointly and iteratively, using the elite frames for correcting other erroneous frames. It outputs the decoded bits frame by frame, and the resulting DLL frames are mapped to network packets.

One common feature of the prior art iterative cross-layer decoders is that each FEC frame is decoded in isolation of other FEC frames, without exchanging information between FEC frames. The inventors of the present invention have noticed that in many multimedia communication systems, along with the intra-frame redundancy, there exists a source of inter-frame redundancy, wherein some information persist from one FEC frame to another. Furthermore, in communication systems for transmitting multimedia signals, such as wireless DTV systems, the persistent information is not limited to the headers of the application-level packets, but exists in various forms at most, if not each, layers of the used protocol stack.

Accordingly, there is a need for a method of multi-layer decoding that would utilize the inter-frame redundancy as well as the persistent information from a plurality of network layers.

SUMMARY OF THE INVENTION

The present invention relates to a method for decoding a multimedia communication signal comprising a sequence of frames generated using a multi-layer protocol stack, the multilayer protocol stack comprising a first error correction (EC) layer and at least one upper layer. According to one aspect of the invention, the method comprises a) performing an EC processing of one or more first frames of the signal at the first EC layer to obtain one or more decoded frames, b) processing the one or more decoded frames at an at least one upper layer to identify therein a plurality of persistent bits, and saving said plurality of persistent bits in memory, and c) using one or more saved persistent bits in the EC processing of a second frame to obtain a second decoded frame, wherein the second frame is different from any of the one or more first frames. The plurality of persistent bits may comprise at least one of: a program guide, null packets, and service information.

In one aspect of the present invention, the EC processing comprises iterative EC decoding, and the method includes: d) performing one or more iterations of the EC decoding of the second frame; e) detecting one or more errors in the second frame; f) identifying positions of persistent bits in the second frame; g) substituting bits of the second frame at the identified positions with the one or more persistent bits from the one or more first frames saved in the memory to obtain a corrected second frame; and, h) performing one or more iterations of the EC decoding of the corrected second frame to obtain a decoded second frame.

BRIEF DESCRIPTION OF THE DRAWINGS

The invention will be described in greater detail with reference to the accompanying drawings which represent preferred embodiments thereof, in which like elements are indicated with like reference numerals, and wherein.

DETAILED DESCRIPTION

One aspect of the present invention relates to using deterministic data within a communication signal in iterative error correction (EC) decoding, thereby realizing extra coding gain. The term "deterministic" is used herein to refer to information, for example in the form of bits and bit sequences, that is repeated from one frame to another for at least a certain time duration, typically from a few seconds to several hours or longer. This kind of persistent data includes, but is not limited to, packet and frame headers of different networking layers, as well as synch bits, preambles etc. Note that in the context of this specification, the terms "deterministic" and "persistent", when used in reference to information, data, bits, symbols, sequences, etc, are used interchangeably. In multimedia signals, such as digital television (DTV) signals that are primarily considered in the following detailed description by way of example, the persistent data also includes electronic program guide (EPG), service information (SI) and NULL TS (transport stream) packets. The term multimedia signal, as used herein, means a signal carrying one or more of the following: video data, audio data, text, speech data, still images, program related data, for example close captioning, and non-real time data.

In a multimedia data stream, a significant number of information bits have to be transmitted periodically. They are frequently repeated in order to keep the receiver start up time, such as the time needed to turn on a TV set or change a TV channel, to an acceptably low level. Key data such as SI, EPG, station ID, video/audio format descriptors are transmitted frequently. It is estimated that this repetitive information may occupy anywhere between 5 and 10% of the data throughput. The EPG provide users of television, radio, and other media applications with continuously updated menus displaying scheduling information for current and upcoming programming. Service Information may describe, for example, the structure of the data stream, as well as schedule information, detailed information about the elements of a service, language information and network information.

Furthermore, video encoders usually output variable bit rate data depending on the video content, whereas most communication and broadcasting channels are using fixed rate. A data buffer is typically implemented at the video encoder output to smooth out the data rate. When there is a buffer underflow, the transport layer fills the output data with deterministic NULL TS packets. Our study shows that there are about 5-7% of NULL packets in a typical MPEG coded video stream.

The present invention makes use of this repetitive and deterministic information to facilitate error correction (EC) decoding at the receiver.

Figure 1:
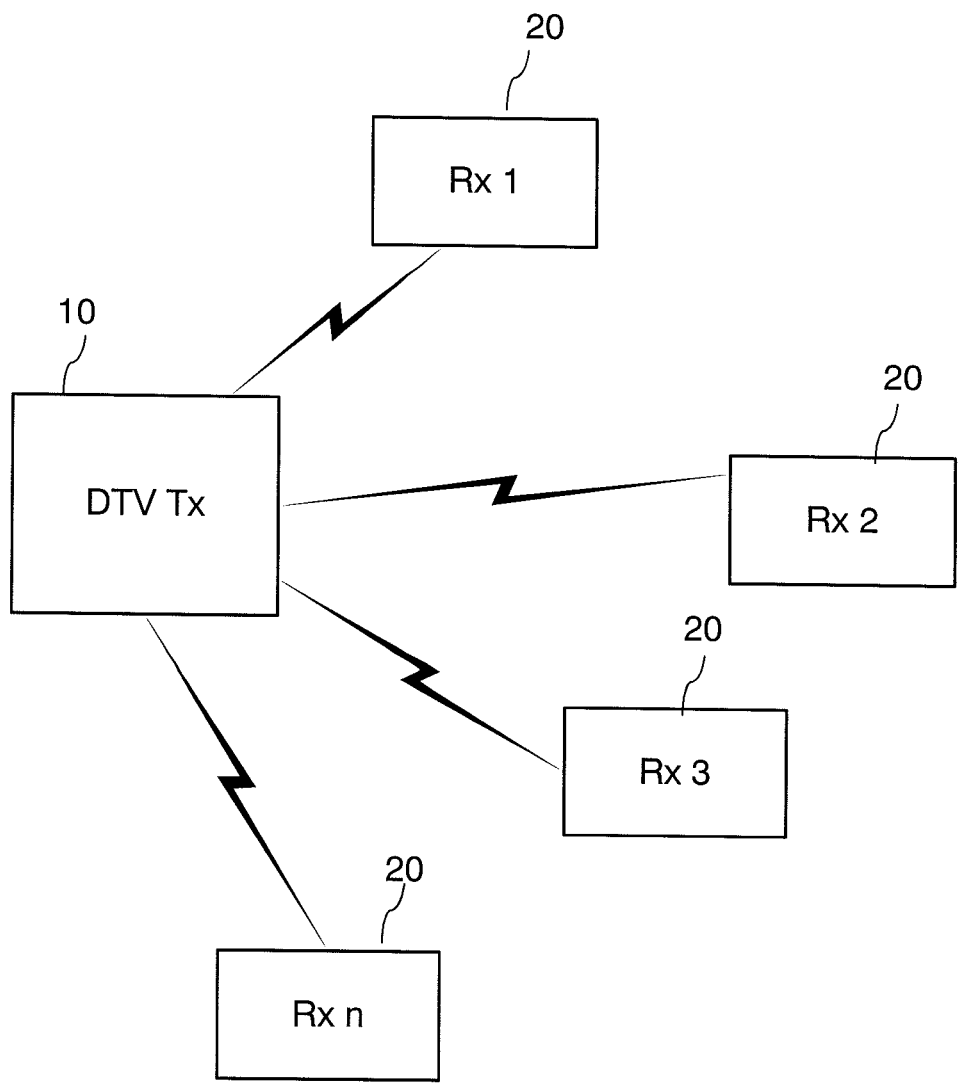
FIG. 1 is a schematic block diagram of a multimedia communication system.

Referring now to FIG. 1, there is generally illustrated an exemplary communication system 1 wherein aspects of the present invention may be utilized. It includes a transmitting station 10, also referred to herein as the transmitter 10, and a plurality of receivers 20. As illustrated, the communication system 1 is a broadcasting system, such as a DTV broadcasting system, however the preset invention is also applicable to two-way communication systems. The transmitter 10 and the receivers 20 may be transceivers that may both emit and receive multimedia communication signals. In one embodiment, the transmitter 10 communicates with the receivers 20 wirelessly, with the transmission environment providing a noisy communication channel that may include multipath interference and may lead to reception errors, thereby necessitating the use of forward error correction (FEC) channel coding by the receivers and transmitters in the network. Examples of the receivers 20 include mobile DTV receivers, cell phones including smart phones, stationary DTV receivers, other mobile and stationary devices capable of receiving and EC processing multimedia communication signals.

Figure 2:
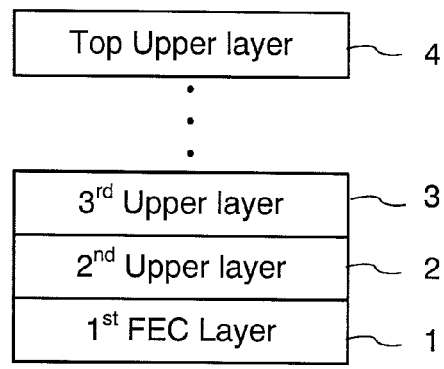
FIG. 2 is a schematic diagram illustrating a generalized multilayer protocol stack employed by transmitters and receivers of the multimedia communication system of FIG. 1.

The transmitter 10 generates a multimedia communication signal using a multilayer protocol stack 33 that is generally illustrated in FIG. 2. The multilayer protocol stack used in the transmitter 10 and receivers 20 includes a FEC layer 1, also referred to herein as the first EC layer, and at least a second upper layer 2. In the shown example, the multilayer protocol stack 33 also includes the third upper layer 3 and the top upper layer 4, and may also include one or more additional layers between the upper layers 3 and 4. The layers of the multilayer protocol stack 33 may correspond to the OSI layer model as described hereinabove, or may deviate from it, for example as defined by a used network Standard when applicable. The FEC layer 1 may correspond to the PHY layer of the OSI model, or the DLL if the PHY layer is defined so as to not include a FEC coder. Generally, the FEC layer 1 is the lowest layer that is responsible for FEC channel coding. The $2^{nd}$ upper layer 2 may be responsible for forming upper-layer data packets, such as IP packets or MPEG packets, and providing a stream of such upper layer packets to the FEC layer 1 for forming a FEC frame, which may also be referred to herein as a FEC block. One FEC frame or block may include one upper layer packet or a sequence of a pre-defined number of the upper layer packets, and may also include a plurality of parity symbols generated by a FEC encoder of the FEC layer 1 of the transmitter 10. Hereinafter the terms "FEC frame" or "FEC block" may also be used to refer to the systematic part of the output block of symbols of a FEC encoder where it cannot lead to a confusion. The systematic part of the FEC frame may also be referred to as the coding block, while the FEC frame with the parity symbols may also be referred to as a codeword.

Figure 3:
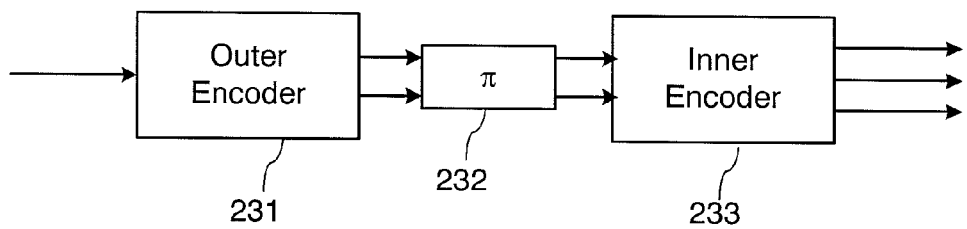
FIG. 3 is a schematic block diagram of a turbo encoder.

Referring now to FIG. 3, there is illustrated an exemplary FEC encoder 230 that may be used in the FEC layer 1 of the transmitter 10. In the FEC encoder 230, an interleaver 232 is sandwiched between an outer and inner encoders 231, 233 so as to generate a serial concatenated code (SCC), such as a serial concatenated convolutional code (SCCC). Such encoders are also referred to as turbo encoders and are currently used in many communication systems. The output of the encoder 230 is a sequence of FEC frames that include parity symbols. These frames are then transmitted over the noisy channel, for example wirelessly, to the receiver 20, wherein it is iteratively decoded using a suitable decoder, such as a turbo decoder that is well known in the art.

By way of a first example, the communication system of FIG. 1 may use the DVB-T2 DTV standard, which is being implemented in Europe. By way of a second example, the communication system of FIG. 1 may utilize the ATSC Mobile DTV standard, also referred to as the ATSC M/H (mobile/handheld). Each of these DTV standards employs a multilayer protocol stack at the transmitter 10 and the receivers 20. Furthermore, each of these standards employ the LDPC or turbo approach to FEC encoding, utilizing concatenated codes and iterative decoding at the receivers.

Figure 4:
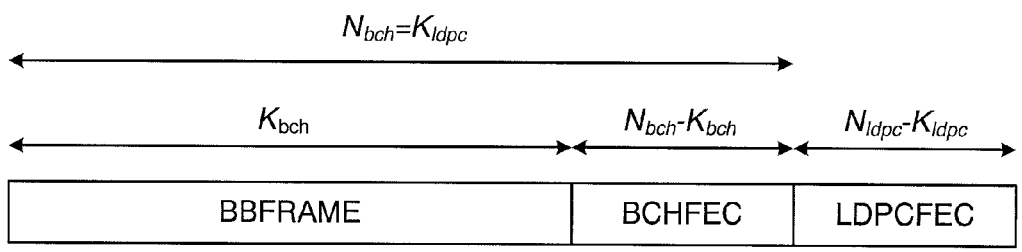
FIG. 4 is a schematic representation of an output FEC frame according to the DVB-T2 DTV standard.

The FEC layer of the DVB-T2 DTV system employs outer BCH coding and inner LDPC coding. The input streams of the FEC encoder of the DVB-T2 DTV system is composed of BBFRAMES and the output stream of FECFRAMEs. Each BBFRAME consist of $K_{bch}$ bits and is processed by the FEC encoder to generate a FECFRAME of $N_{ldpc}$ bits; by way of example, $N_{ldpc}$ may be 64800. The parity check bits BCHFEC of the systematic BCH outer code are appended after the BBFRAME, and the parity check bits LDPCFEC of the inner LDPC encoder are appended after the BCHFEC field, as shown in FIG. 4 illustrating one FECFRAME.

ATSC Mobile DTV is an American standard, which allows TV broadcasts to be received by mobile devices, see ATSC-M/H Standard, Mar. 13, 2009. ATSC, ATSC Standard A/153, which is incorporated herein by reference. ATSC-M/H is an extension to the DTV broadcasting standard ATSC A/53 optimized for wireless mobile devices (receivers 20). ATSC is optimized for a fixed reception in the typical North American environment and uses 8-VSB modulation.

ATSC-M/H combines multiple error protection mechanisms for added robustness in mobile environment. It utilizes an outer Reed Solomon (RS) Code which corrects defective bytes after decoding the outer convolutional code in the receiver. The correction is improved by an additional CRC checksum whereby at the receiver bytes can be marked as defective before they are decoded (Erasure decoding). In the ATSC-M/H embodiment, the FEC frame at the input of the encoder 230 is referred to as the RS Frame. The output of the encoder 230 is a code word of a serially concatenated convolutional code (SCCC), in the form of a FEC frame with added parity symbols.

Figure 16:
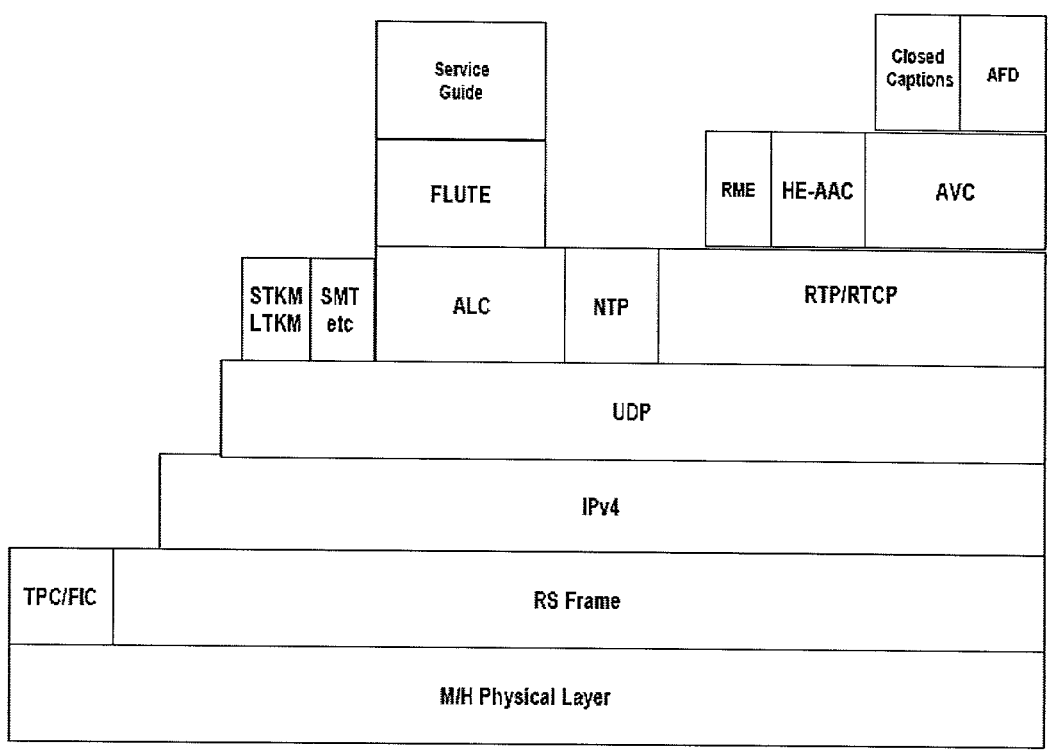
FIG. 16 is a diagram illustrating the network layer model of the ATSC M/H standard.

FIG. 16 illustrates the layer model of the ATSC-M/H Standard, indicating different protocols and other components of the layers. This multilayer protocol stack comprises the first EC layer—RS Frame, as well as a number of upper layers, including IPv4, UDP, RTP/RTCP, AVC, Closed Captions, and Active Format Description (AFD).

Figures 5, 6:
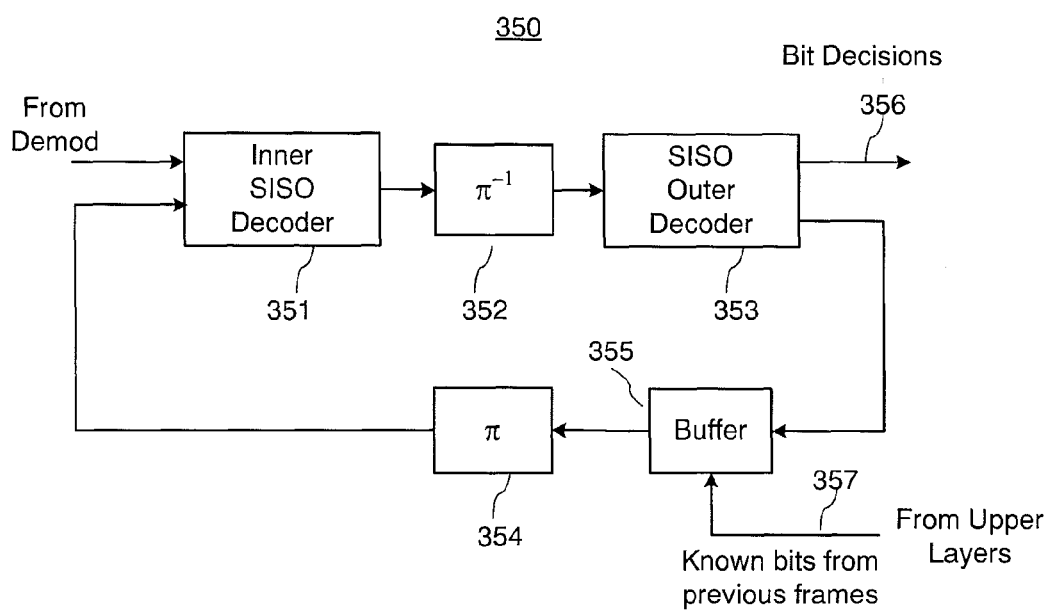
FIG. 5 is a schematic diagram of an RS Frame according to the ATSC-M/H standard.
FIG. 6 is a schematic block diagram of an iterative FEC decoder with a known bits feedback from upper layers.

FIG. 5 illustrates a possible organization of the RS frame. According to the ATSC-M/H Standard, it includes a Service Map Table (SMT), a Service Labeling Table (SLT), a Guide Access Table (GAT), a Cell Info Table (CIT), a Rating Region Table (RRT), a detailed description of which can be found in the ATSC-M/H Standard; these tables are examples of the service information (SI) and are generated at the application layer of the multilayer protocol stack of the ATSC-M/H, and are conventionally placed at the beginning of the RS frame. The stuffing bytes are the MPEG null packets which are conventionally placed at the end of the RS frame.

With reference to FIG. 6, there is illustrated an iterative FEC decoder (IFD) 350 according to an embodiment of the present invention. The IFD 350 may be used in the FEC layer 1 of the receivers 20 to decode the EC code generated by the encoder 230. It includes an inner soft input, soft output (SISO) decoder 351 for decoding the outer code generated by the outer encoder 231, and an inner SISO decoder 353 for decoding the inner code generated by the inner encoder 233. A de-interleaver 352 is included between the outer and inner SISO decoders 351, 353, which operates in reverse to the interleaver 232. Soft output from the outer SISO decoder 353 is provided, through an interleaver 354, to the inner decoder 351 as extrinsic information, as known in the arts. Hard output 356, in the form of hard bit decisions, is provided to upper layers of the receiver 20. In operation, the FEC decoder 350 iteratively processes each received FEC frame generally as known in the art, except for modifications related to a buffer 355 and the provision of saved persistent bits from a previously decoded FEC frame, as generally shown by the arrow 357 and is further explained hereinafter. The iterative processing of each received FEC frame continues until an error detector at the output of the outer decoder 353 detects the absence of errors in the hard output 356 of the outer decoder 353, or until a predetermined termination condition is met, for example until a maximum number of iterations is reached.

The use of the persistent bits and bit sequences in iterative FEC decoding of a multimedia signal according to an embodiment of the present invention will now be described with reference to FIGS. 7 and 8.

Figure 7:
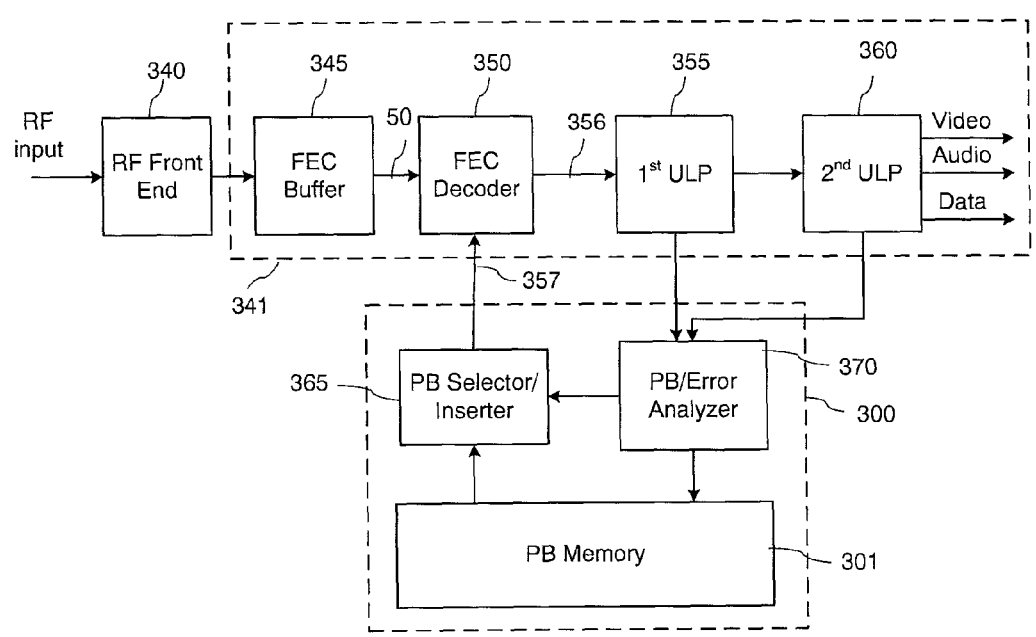
FIG. 7 is a schematic block diagram of an iterative multi-layer decoder.

With reference to FIG. 7, there is illustrated a schematic block diagram of a front end portion of the receiver 10 in one embodiment thereof. It includes an RF front-end receiver circuit 340, which connects to a digital decoder circuit (DDC) 341 that includes a FEC buffer 345, followed by the IFD 350, which is in turn followed by upper layer processors that are represented in the figure by the first upper layer processor (ULP) 355 and the second ULP 360, which perform respective upper layer processing tasks as known in the arts. The RF front end circuit (RFFC) 340 converts a received analog RF signal carrying multimedia, such as DTV, data, and converts it into a digitized sequence of signal samples, which is then sliced into 'soft' FEC frames using the FEC buffer 345. Design option for the RFFC 340 are well known in the art and will not be described here. The IFD 350 receives a sequence of the 'soft' FEC frames 50, and iteratively processes these frames one by one to remove errors, and passes decoded FEC frames to the ULP 355 for the first upper layer processing. Examples of the FEC frames 50 include the RS Frame of FIG. 5 with added parity, and the FECFRAME of FIG. 4.

In contrast with the operation of a conventional iterative decoder of the prior art, the IFD 345 may perform decoding iterations while receiving input from the upper layers with the assistance of a smart controller 300, so as to exploit redundancy that exists in the received multimedia signal. In particular, the smart controller 300 is coupled to the different networking layers of the DDC 341 so that it can exchange data therewith, and in operation analyzes the received signal at different processing layers for the presence of the persistent data, or persistent bits (PB), saves this data in a PB memory 301, and then feeds some of these saved bits back to the IFD 350 as it iterates trying to eliminates errors in a following FEC frame. In addition to the PB memory 301, the smart controller 300 includes a data analyzer 370 and a PB selector 365, which functions are described hereinbelow.

Figure 8:
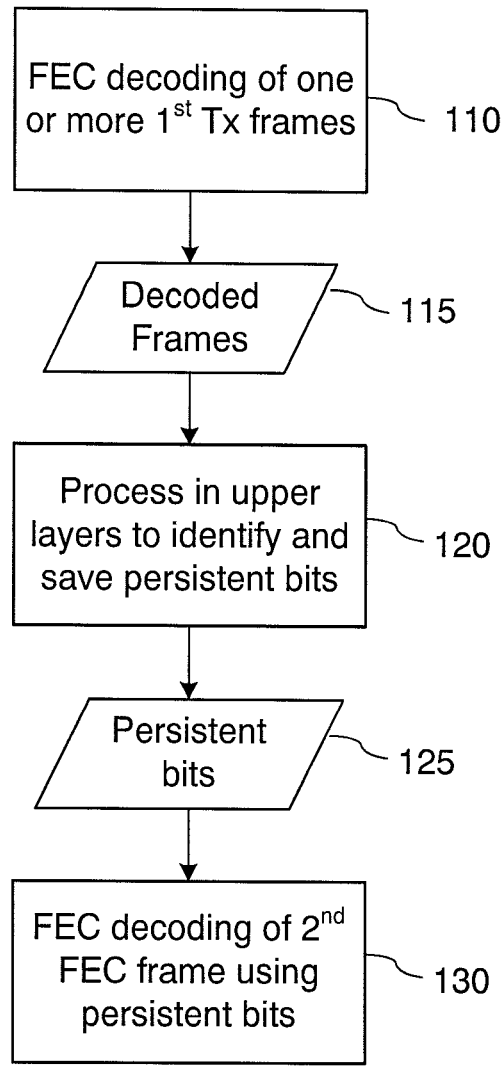
FIG. 8 is a general flowchart of a method for iterative multi-layer decoding of error correction codes.
Figure 9:
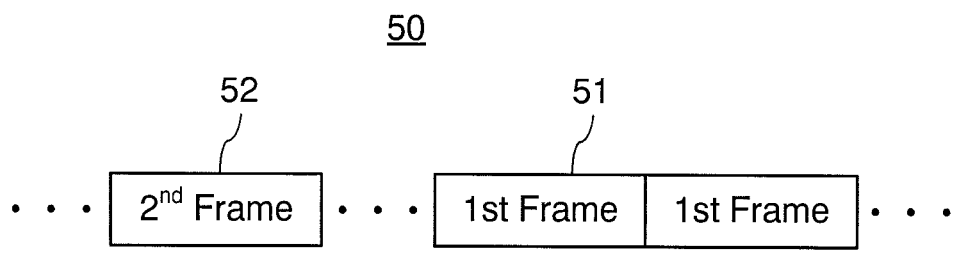
FIG. 9 is a schematic block diagram of a data stream received by the iterative multi-layer decoder of FIG. 7.

Referring now to FIG. 8, a flowchart shown here generally illustrates a method for decoding the multimedia communication signal according to an embodiment of the present invention, which can be implemented using the receiver of FIG. 7. In the shown embodiment the method starts with the IFD 350 receiving the sequence of 'soft' FEC frames 50, which is illustrated in FIG. 9. In step 110, the IFD 350 iteratively processes one or more first frames 51, and passes one or more resulting decoded FEC frames 115 to the ULP 355 for upper layer processing as known in the art. During the upper layer processing, in step 120 the data analyzer 370 of the smart controller 300 identifies persistent data 125 that may be present at the various layers of the decoded frames 115, and saves said persistent data 125 in the PB memory 301.

Next, in step 130, the FEC decoder 350 receives a second FEC frame 52, and uses one or more persistent bits from the saved persistent data 125, as supplied by the smart controller 300, in the FEC processing of the second FEC frame 52, so as to obtain a second decoded FEC frame. Note that although the second FEC frame 52 is generally different from any of the preceding first FEC frames 51, they share a certain number of persistent bits that have already been decoded and are thus known and may be used to assist in the decoding of the second FEC frame 52.

Figure 10:
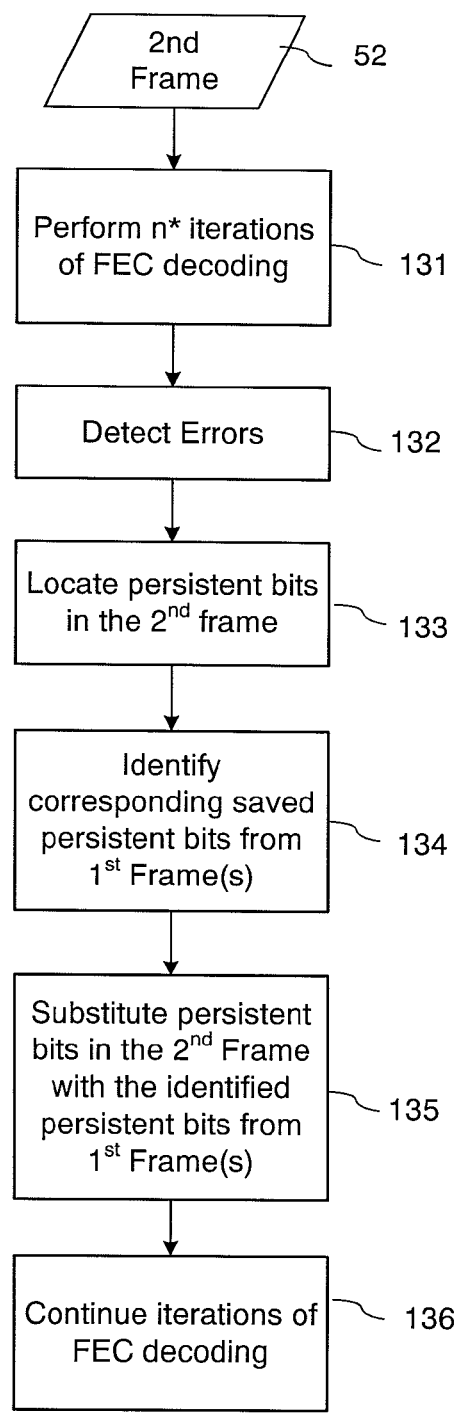
FIG. 10 is a flowchart of one iteration of the iterative multi-layer decoder.

FIG. 10 further illustrates the processing involved in step 130 of the method of FIG. 8. According to an embodiment of the present invention, this processing may involve the following steps:

Step 131: Upon receiving the second FEC frame 52, the IFD 350 attempts to decode the underlying FEC code to obtain an error-free decoded frame by performing one or more decoding iterations as known in the art.

Step 132: After a pre-defined number n* of the FEC decoding iterations upon the second FEC frame 52, the hard output 356 (see FIG. 6) of the IFD 350 is checked for errors, and passed for processing to the upper layer processors 355, 360 as a provisionally-decoded second frame. Here, n*≥1 and is a system design parameter that can vary from 1 to 10 or more. The data analyzer 370 of the smart controller 300 may analyze the provisionally-decoded second frame to identify the persistent bits at each or some of the upper layers. If there is no errors, the resulting decoded frame is processed by the upper layer processors as known in the art. Optionally, the smart controller 300 may update the saved persistent bits in the PB memory 301 as required.

The following approaches may be used to identify the positions of persistent bits in the first frame and second frame as they are passed to the upper layer processors:

1) By fixed location: In FIG. 5, some controllable persistent bits are placed at the beginning and end of frame buffer. That is, SMT, SLT, GAT, CIT, RRT are service information placed at the beginning of the frame, and stuffing bytes are the MPEG null packets placed at the end of the frame.

2) By fixed time interval: For example, EPG and SI can be transmitted periodically, for example once a second, so that they can be easily detected at the receiver based on the fixed time interval.

3) By protocol identifier: Most protocols have special identifier at the lower level packet.

For example, UDP is carried by IP protocol. In the field of "protocol" of IP header, "0x11" represents UDP.

As another example, in an ATSC 8-VSB system, both SI and MPEG null packets are carried by an MPEG transport stream (TS), which is formed by a sequence of MPEG packets 101, each 188 bytes long, as shown in FIG. 1. Each MPEG packet 101 includes a 4 byte header 103 and a 184 byte payload 105.

SI and MPEG null packet are identified by a 13-bit packet ID (PID), which is a part of the MPEG header 103.

MPEG null packet is identified by the PID 0x1FFF.

SI involves 4 tables: Program Association (PAT), Program Map (PMT), Conditional Access (CAT), and Network Information (NIT). The MPEG-2 specification does not specify the format of the CAT and NIT. SI and EPG are estimated to take about 5 to 10% of the payload throughput of a DTV data stream.

PAT stands for Program Association Table. It lists all programs available in the transport stream. Each of the listed programs is identified by a 16-bit value called program_number. Each of the programs listed in PAT has an associated value of PID for its Program Map Table (PMT).

The value 0x0000 of program_number is reserved to specify the PID where to look for Network Information Table (NIT). If such a program is not present in PAT the default PID value (0x0010) shall be used for NIT. MPEG TS Packets 101 containing PAT information always have PID 0x0000.

Program Map Tables (PMTs) contain information about programs. For each program, there is one PMT. While the MPEG-2 standard permits more than one PMT section to be transmitted on a single PID, most MPEG-2 "users" such as ATSC and SCTE require each PMT to be transmitted on a separate PID that is not used for any other packets. The PMTs provide information on each program present in the transport stream, including the program_number, and list the elementary streams that comprise the described MPEG-2 program. Also known and can be used for SI identification are locations for optional descriptors that describe the entire MPEG-2 program, as well as an optional descriptor for each elementary stream. Each elementary stream is labeled with a stream type value.

Step 133: If after the first n decoding iterations an error detector still detects the presence of uncorrected errors in the hard output 356 of the IFD 350, the data analyzer 370 of the smart controller 300 determines the positions of persistent bits and optionally analyzes them for errors.

Step 134: Once the persistent bits in the second frame are identified, the PB selector 365 selects in the PB memory 301 corresponding saved persistent bits 357 from the first FEC frames 51.

Step 135: In the IFD 350, the selected saved persistent bits 357 from the first frames 51 are inserted into the second frame 52 at the corresponding persistent bit positions to obtain a corrected second frame.

Step 136: the IFD 350 performs one or more iterations of the FEC decoding of the corrected second frame to obtain a decoded second frame.

Turning back to FIG. 6, in one embodiment of the invention the insertion of the saved persistent bits is accomplished using a buffer 355 that is connected in the feedback path of the IFD 350, for example between the outer decoder 353 and the interleaver 354. This buffer may be used for the insertion of the saved persistent bits at the corresponding persistent bit positions in the soft output of the outer decoder 353.

According to an aspect of the present invention, the aforedescribed iterative multilayer, inter-frame decoding may utilize various kinds of persistent data collected and saved by the smart decoder 300 at different networking layers. The persistent data may be gradually fed back to the IFD 350 until it produces an error-free output, or a maximum number of iterations is reached and the frame is discarded.

Figure 11:
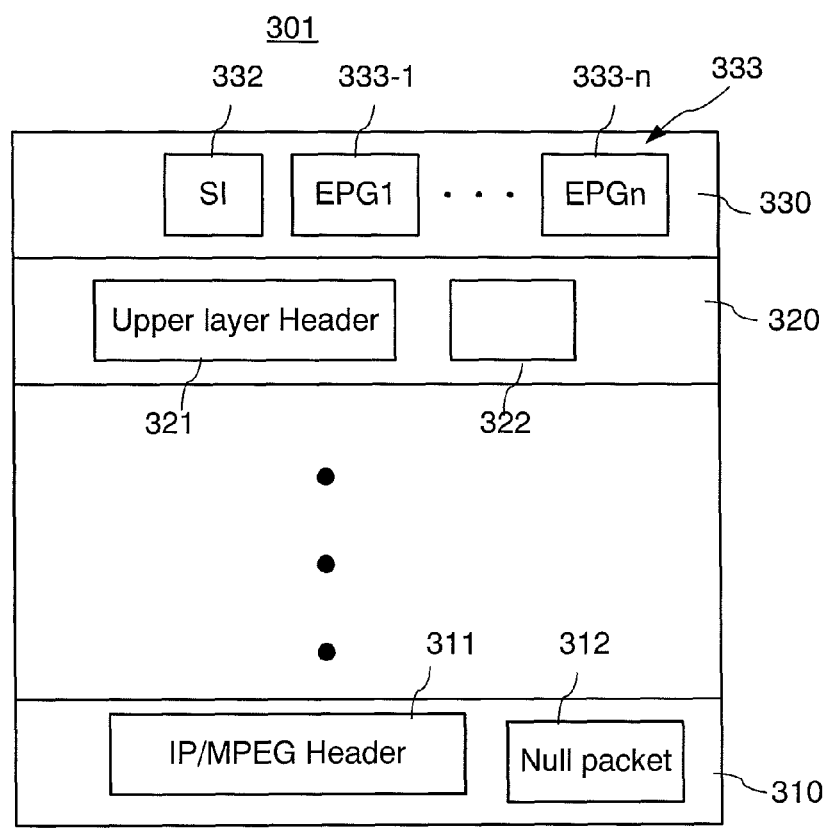
FIG. 11 is a schematic diagram representing the content of a memory for storing persistent bits in a smart controller of the iterative multi-layer decoder.

Referring to FIG. 11, there is illustrated the PB memory 301 containing different types of persistent data saved from successfully decoded frames for use in EC decoding of future FEC frames. In the illustrated embodiment, the PB memory 301 includes a plurality of memory regions 310, 320 and 330 for saving persistent data detected at different layers of the used protocol stack. In the shown example, memory region 310 contains headers 311 of the first upper layers, such as the DLL and/or the transport layer; examples include MAC, IP and MPEG headers. It may also include a null TS packet, such as an MPEG null packet, that is inserted by the transmitter for frame payload padding as described hereinabove. The exact content of the null packet is system dependent and may differ for different equipment manufacturers. Accordingly, in the illustrated embodiment the content of null packets is determined from successfully decoded frames, such as the first frames 51, and saved in the PB memory 301. Memory region 320 includes packet headers 321 from other upper layer, such as RTP/RTCP, as well as other deterministic data 322 that may be used at the upper protocol layers.

Memory region 330 contains saved service information (SI) 332 and EPG 333, which may be divided in several EPG portions represented by blocks labeled 333-1 and 333-n. The SI 332 may include conditional access data, program rights management data, transmitter sync and network control data, and non-real-time (NRT) data, etc, each of which may be saved separately for easier identification. The EPG 333 carries the program schedule and program description for a predefined period of time, for example several hours, and thus may change every few hours or as frequently as required, but in a large part persists for a relatively long periods of time. In a short term, the same EPG is transmitted by the transmitter 10 every few seconds, and can be used as persistent data in the aforedescribed iterative inter-frame decoding. Since a typical size of the EPG exceeds the size of one FEC frame, and may be as high as several megabits, it may be transmitted over a sequence of FEC frames, occupying a portion of each frame and sharing it with video and audio packets of the DTV signal. These portions are identified by the smart controller 300 from successfully decoded FEC frames, such as the first FEC frames 51, and may be stored in the PB memory 301 separately, as represented by the memory blocks 333-1, 333-n in FIG. 11, for easier identification. The EPG transmission may be repeated at certain points in time, for example periodically with a defined time period, or may be repeated every X frames, where X is a pre-determined number set by the transmitter. The smart controller 300 may be programmed to identify the EPG transmission pattern and periodicity, including Frame or Time interval, size of EPG, location in the FEC frame, and use this information to facilitate the selection of suitable persistent bits to assist in decoding of a future FEC frame, such as the second FEC frame 52, that contains errors.

By way of example, in the case of the ATSC-M/H system, persistent bits stored in the PB memory 301 may include: M/H Physical Layer: sync bits, training sequences; RS Frame Layer: NULL Transport Stream (TS) packets; IPv4/UDP/RTP/RTCP Layer: packet header and other overheads; AVC Layer: video coding overheads, such picture size, GoP size, etc.; Others: program guide, service information, closed captions, AFD.

According to one embodiment of the invention, the smart controller 300, while processing the provisionally-decoded second FEC frame 52 having uncorrected errors, identifies therein bit positions of a first group of persistent bits, which are referred to herein as the first bit positions, and bit positions of a second group of persistent bits, which are referred to herein as the second bit positions.

By way of example, the first group of persistent bits may be the MPEG null packets, and the second group of persistent bits may be a portion of the EPG. The identification of the EPG may be accomplished, for example, as follows. Based on the transmission history, the smart controller 300 may determine whether the second frame 52 is likely to carry a portion of the EPG, and which portion it is likely to carry. The smart controller may further determine, for example based on the transmission history, a likely location of the EPG portion in the FEC frame 52. The smart controller 300 may further use cross-correlation of the provisionally-decoded second FEC frame 52 with the EPG 333, or a corresponding portion thereof such as 333-1 or 333-n, received with the first FEC frames 51. If the cross-correlation function has a spike, the EPG in the second FEC frame 52 is detected and matched with the EPG 333, or the currently tested portion thereof, from the previously decoded FEC frame 51. The height of the cross-correlation spike may indicate how many bits are matched. Similarly, both the presence and the location of the null packets in the second frame 52 may be identified by cross-correlating portions of the second FEC frame 52 with the saved null packet 312.

Once the positions of the first and second groups of persistent bits in the second FEC frame 52 are identified and the saved persistent bits corresponding thereto are found in the PB memory, the found saved persistent bits from the first group may be inserted at the first positions in the second frame 52, and the found saved persistent bits from the second group may be inserted at the second positions in the second frame 52. In the context of this specification, 'inserting persistent bits into a frame' being decoded may mean substituting soft bit values in the frame with values corresponding to the respective persistent bits, as will be interpreted by the decoder. For example, in bi-polar bit representation, inserting a persistent bit "+1" may take the form of inserting "+M", where 'M' is a large enough value, for example +10, to indicate high probability of '+1' to the decoder.

By way of example, once the first n* iterations of the FEC decoder 350 have failed to produce an error-free decoded frame from the second FEC frame 52, the smart processor 300 may first identify bit positions of the null packets in the second FEC frame 52, feed the saved bits of the null packet 312 back to the IFD 350, and insert them into the soft output of the outer decoder 353, which is saved in the buffer 355, at the proper bit positions of the null packets as identified by the smart controller 300. The IFD 350 may continue its iterations using a thereby corrected 'soft' output of the outer decoder 353. The smart decoder 300 may next locate EPG bit positions in the second FEC frame, and identify corresponding EPG bits 333 saved from the previously decoded first FEC frame 51. If the next one or more iterations of the IFD 350 do not correct all the detected errors, the identified saved EPG bits 333 are fed back to the IFD 350, and inserted at a next iteration into the soft output of the outer decoder 353 at the corresponding EPG bit positions, as identified by the smart controller 300, after which the FEC decoding iterations continue.

The insertion of the previously decoded persistent bits into a FEC frame being decoded facilitates the error correction and a successful decoding of the frame for two reasons: a) the inserted known persistent bits are error free, and thus any errors in the persistent bits are automatically corrected, and b) the insertion of the known bits facilitates the decoding of information bits in their vicinity. We found that, depending on shortening characteristics of a FEC code used, the resulting overall decoding gain may depend on the positions of the persistent bits in the FEC frame. Many of the FEC codes that are currently used in communication systems provide unequal error protection (UEP), wherein bits within the coding block are protected to a different degree, depending on the bit position within the block. One example of a UEP code is an irregular LDPC code such as that used in DVB-T2. An LDPC code is regular if the rows and columns of its parity check matrix, H, have uniform weight; otherwise, it is irregular. An irregular LDPC code provides unequal error protection for bits at different positions in the coding block. According to an aspect of the present invention, the persistent bits which positioning within the frame can be controlled at the transmitter, are preferably placed at bit positions of the coding block leading to a highest FEC coding gain. These specific positions in the FEC frame are related to the shortening property of the FEC code used, and can be identified by those skilled in the arts using known algorithms.

The persistent bits may be classified into two categories: 1) controllable deterministic bits (CBs), which can be arranged to any desired position in a FEC block; and, 2) uncontrollable deterministic bits (UBs), which can only be arranged at a certain position in the data stream. Which persistent bits belong to UBs may somewhat vary from system to system; examples may include upper layer headers. The EPG, SI and MPEG NULL packets, or generally null packets of the TS stream, may be classified as controllable persistent bits, and can be arranged within the FEC frame as desired.

Figure 12:
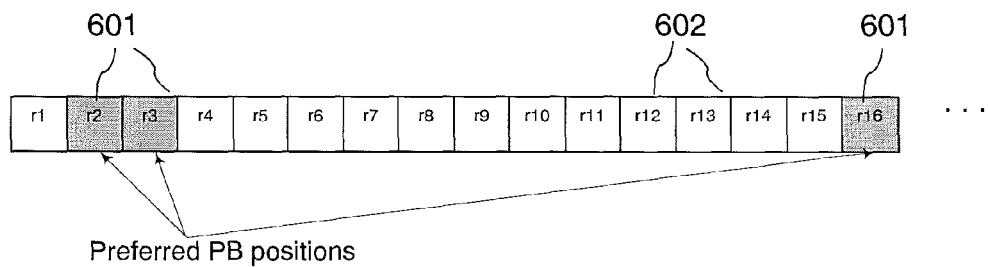
FIG. 12 is a schematic diagram of a coding block of an irregular LDPC code.

FIG. 12 illustrates by way of example one coding block of a UEP FEC code, such as the irregular LDPC code. Bit positions in the block are indicated by squares. White squares 602 indicate bit positions characterized by a relatively stronger error protection, and shaded squares 601 indicate bit positions having a relatively weaker error protection, as compared to the bit positions 602. According to an embodiment of the present invention, the controllable persistent bits are placed at the bit positions 601 having the relatively weaker error protection. At the IFD 350 of the receiver 20, these bits are substituted with the saved persistent bits from the previously decoded frame, which are known to be error-free. At the same time, this positioning of the persistent bits advantageously enables placing information bits that are unknown at the receiver at the bit positions 602 having the relatively stronger error protection, thereby facilitating their decoding.

By way of example, our simulations have shown that, for DVB-T2 rate ⅝ length 64800 codes where 4% of the decoding block are controllable persistent bits, the decoding gain of random insertion of these persistent bits is 0.41 dB, while the decoding gain of the optimum insertion as described hereinabove is 0.53 dB.

Figure 13:
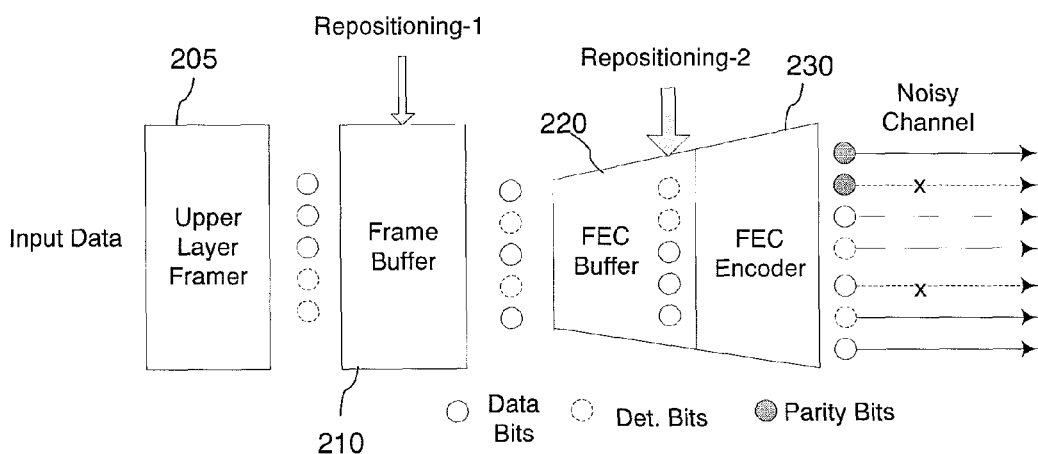
FIG. 13 is a schematic block diagram of an error correction encoder with persistent bits re-positioning.

One possible procedure for positioning of the persistent bits at the transmitter 10 will now be described with reference to FIG. 13, which shows a schematic block diagram of an output signal-encoding portion of the transmitter 10. It includes an upper-layer framer 205, which formats input data into transmission frames to be encoded and represents data processing at the networking layers above the FEC layer, and which is followed by a TS frame buffer 210, which is in turn followed by a FEC buffer 220 and the FEC encoder 230. Information data bits are represented by solid circles, persistent bits are represented by dashed circles, and parity bits are presented by shaded circles. The term "transmission frame" is used herein to mean an encoding block of the channel FEC, which the FEC encoder 230 processes in parallel to add parity bits.

At the transmitter, the possible positioning of the controlled deterministic bits may involve two steps:

Step-1: re-positioning in the frame buffer 210, and
Step-2: re-positioning in the FEC encoding buffer 220.

A goal of Step-1, which is represented in FIG. 12 by an arrow labeled "Repositioning-1" is to make the detection of the known persistent bits at the receiver easier. There may be several ways to transmit the EPG, the SI and the MPEG null packets, for use in iterative decoding at the receiver:

1) By fixed time interval: For example, the program guide and the service information can be transmitted periodically, once a second, so that receiver can easily detect them based on fixed time interval.

2) By location: The multimedia transmission systems arrange the data in frames, e.g., in a M by N frame. We can specify that all program guide and service information are to be transmitted at the beginning of the frame. This will make the detection in the receiver easier. An optional pointer could also be used as part of the service information to point to the end of the program guide and service information in a frame. This can further assist the detection of the service information by the smart controller at the receiver.

3) The approaches (1) and (2) can be used concurrently.

4) NULL packets, used as frame padding, may be inserted at the end of the frame for easy detection. An optional pointer can also be used to point to the start of the NULL packets.

These approaches to the positioning of the controllable persistent bits within a coding block of the FEC may be applied to both one-dimensional codes and two-dimensional codes.

For example, in the RS frame illustrated in FIG. 5 the controllable known bits within SMT, SLT, GAT, CIT, RRT, and "stuffing bytes" are shown placed at the beginning and end of the frame buffer. Pointers with extra error protection may be optionally added, indicating the end of service information and the beginning of null packets.

Step-2, which is represented in FIG. 12 by an arrow labeled "Repositioning-2", may be performed at the FEC buffer 220, before the FEC encoder inserts the parity bits, if the FEC encoder 230 utilizes an UEP code as described hereinabove with reference to FIG. 12. Its goal is to position the controllable persistent bits within the FEC encoding block so as to increase decoding gain at the receiver 20.

When such optimal re-positioning of the persistent bits is performed at the transmitter 10, the receiver 20 may include a buffer (not shown) after the FEC decoder 350 (see FIG. 7), wherein an inverse bit re-positioning procedure is performed to reverse the repositioning-2 at the FEC buffer 220.

Advantageously, embodiments of the present invention may be envisioned that enable to explore and utilize redundant information that is added at all or most networking layers. Furthermore, different networking layers may utilize their own error protection codes, and the decoding of these codes at the respective networking levels of the receiver may utilize the same iterative inter-frame approach as described hereinabove with respect to the iterative decoding of the FEC code at the first FEC layer.

Figure 14:
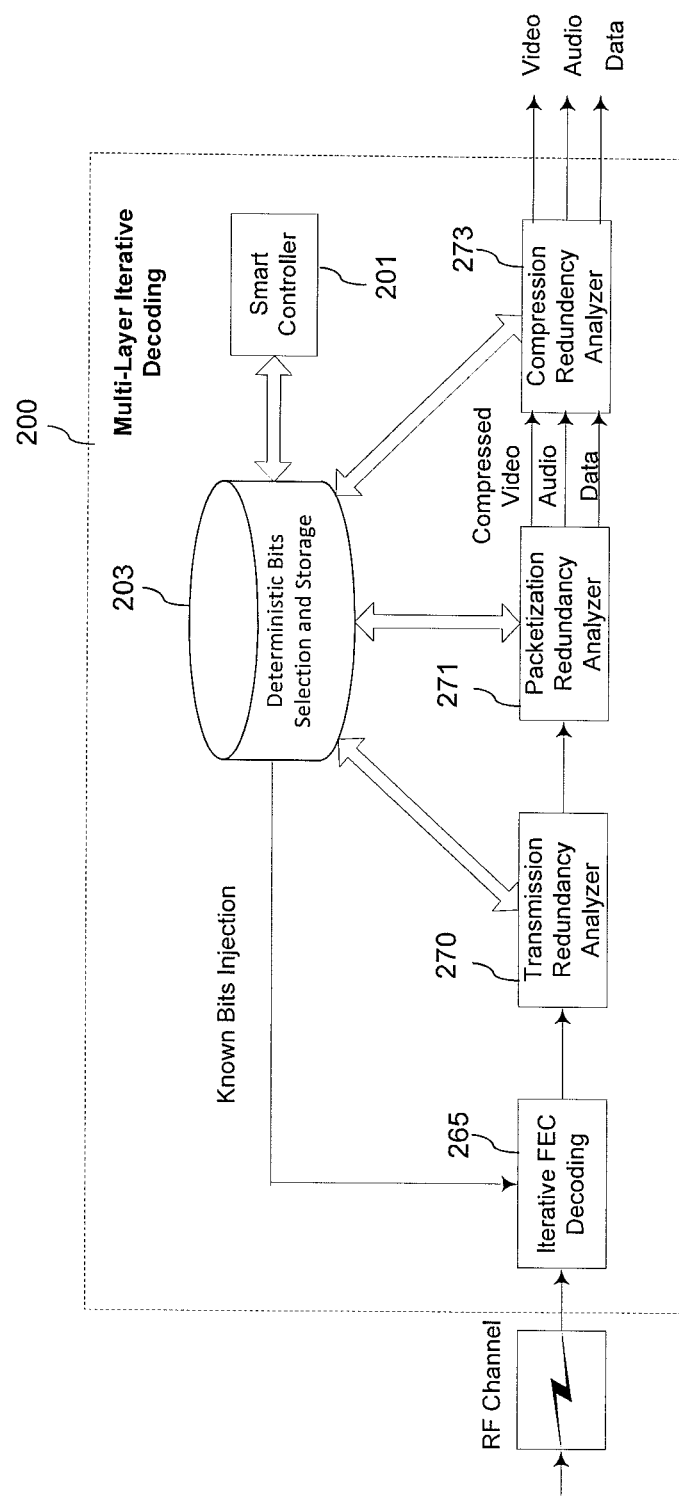
FIG. 14 is a schematic block diagram illustrating an embodiment of the iterative multilayer decoder with multi-layer redundancy analyzers.

FIG. 14 generally illustrates the architecture of such a multi-layer iterative decoder (MLID) 200 according to an embodiment of the present invention. In this architecture, an iterative FEC decoder 265 may be embodied and operate as described hereinabove with reference to FIGS. 6 and 7. Processing blocks 270, 271 and 272 receive decoded frames from the FEC decoder 265, and analyze redundancies present at different layers of the used protocol stack. These redundancies include: Transmission Redundancy: Sync symbols, training sequences, EPG, SI, station logo, NULL TS packets, SFN sync data; Packetization Redundancy: IP headers, packet ID, metadata, conditional access (CA) data; Source Coding Redundancy: MPEG overheads (picture size, GoP size, etc.), audio overheads, etc.

The smart controller 201 detects a variety of source packets, stores a list of historical known bits from all layers in memory 203, analyzes the correlation between past and future packets, and intelligently obtains known bits for each iteration of FEC decoding.

Figure 15:
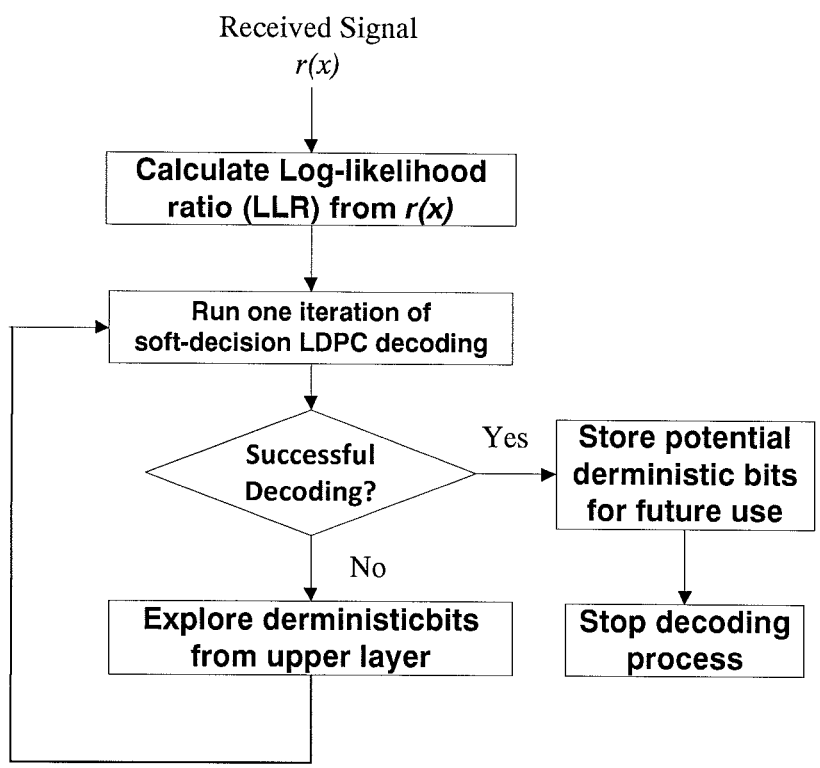
FIG. 15 is a simplified flowchart of the iterative process of multilayer decoding according to an embodiment of the present invention.

FIG. 15 presents an exemplary flowchart of the operation of the MLID 200 for an embodiment utilizing the DVB-T2 DTV standard. First, the iterative decoder conducts the LDPC decoding of the received signal r(x) as known in the art. If the decoding is not successful, the smart controller 201 is used to explore the deterministic bits from all the layers higher than the physical layer. The smart controller 201 can predict the deterministic bits in the current LDPC codeword by analyzing previously received codewords, and is able to identify the information redundancy among different coding blocks. After that, the iterative decoder replaces some information bits with the obtained deterministic bits and conducts a next iteration of the LDPC decoding. This multi-layer iterative decoding process will repeat until the correct LDPC decoding is reached, or a maximum number of iterations is reached.

The iterative inter-frame multilayer decoding described hereinabove with reference to FIGS. 6-15 may be applied, and provide advantages, in all multimedia transmission systems such as digital (terrestrial, Satellite and cable) TV, mobile TV, IPTV, and 3D TV systems, as well as communication systems carrying streamed multimedia payload, such as 3G and LTE, WiMax and Wi-Fi systems. The multilayer decoder and smart controller illustrated in FIGS. 7 and 14 can be implemented in hardware, for example, using a microprocessor with associated circuits implemented as FPGA or ASIC. It can also be implemented on a software platform using a DSP engine. Combined hardware and software approach is also viable. It should be pointed out that the method utilizes persistent bits that exist in today's multimedia signals, but are not used in channel decoding. By providing a smart controller that is programmed, or otherwise configured to search, identify, locate and use those persistent bits, the error correction performance of today's and future multimedia communication systems may be improved.

Although the invention has been described hereinabove with reference to specific exemplary embodiments, it is not limited thereto, but is defined by the spirit and scope of the appended claims. Various improvements modifications of the aforedescribed embodiments will be apparent to those skilled in the art from the present specification. For example, although the invention has been described hereinabove with reference to DTV signals by way of example, the invention may be equally applied to a variety of wireless multimedia applications utilizing different protocol stack, frame structure, modulation and channel coding schemes. Other embodiments and modifications of the embodiments described herein are also possible.

We claim:

1. A method for decoding a multimedia communication signal comprising a sequence of frames generated using a multi-layer protocol stack, the multilayer protocol stack comprising a first error correction (EC) layer and at least one upper layer, the method comprising:
   a) performing an EC decoding of one or more first frames of the signal at the first EC layer to obtain one or more first EC decoded frames;
   b) processing the one or more decoded frames at the at least one upper layer to identify therein a plurality of persistent bits, and saving said plurality of persistent bits in memory; and,
   c) performing an iterative EC decoding of a second frame at the first error correction layer using one or more saved persistent bits to obtain a second EC decoded frame, wherein the second frame is different from any one frame from the one or more first frames;

wherein step (c) comprises:
   d) performing one or more iterations of the iterative EC decoding of the second frame;
   e) detecting one or more errors in the second frame;
   f) identifying positions of persistent bits in the second frame;
   g) inserting the one or more saved persistent bits from the one or more first frames into the second frame at the identified positions to obtain a corrected second frame; and,
   h) performing one or more iterations of the iterative EC decoding of the corrected second frame to obtain the second EC decoded frame.

2. A method of claim 1, wherein the multimedia communication signal comprises a digital TV (DTV) signal, and wherein the one or more saved persistent bits that are used in the EC decoding of the second frame comprise bits from at least one of: a program guide, a null packet, and service information.

3. A method of claim 1, comprising: selecting, in the plurality of persistent bits saved in the memory, the one or more persistent bits for substituting in the second frame.

4. A method of claim 1 wherein the at least one upper layer comprises a second layer and a third layer, and wherein the plurality of persistent bits comprises a first group of persistent bits detected at the second layer and the second group of persistent bits detected at the third layer.

5. A method of claim 4, wherein:
   step f) comprises identifying first positions corresponding to the first group of persistent bits and second positions corresponding to the second group of persistent bits; and,
   steps g), h) comprise:
   i) substituting bits of the second frame at the first positions with bits from the first group of persistent bits, and,
   j) substituting bits of the second frame at the second positions with bits from the second group of persistent bits.

6. A method of claim 5, further comprising performing one or more iterations of the EC decoding of the second frame between steps i) and j).

7. A method of claim 1 wherein the communication signal is generated at a transmitter using an un-equal error protection (UEP) code, the method further comprising the transmitter positioning the one or more persistent bits at the bit positions leading to highest EC decoding gain.

8. A method of claim 7 wherein each of the frames includes bit positions characterized by a relatively weaker error protection and bit positions having a relatively stronger error protection, the method further comprising:
   positioning the one or more persistent bits at the bit positions having the relatively weaker error protection.

9. A method of claim 1, wherein step (g) includes computing a cross-correlation of bits from the second frame with saved persistent bits from the first frame to identify the one or more saved persistent bits for inserting into the second frame.

* * * * *